United States Patent [19]

Nossen

[11] Patent Number: 4,584,541
[45] Date of Patent: Apr. 22, 1986

[54] DIGITAL MODULATOR WITH VARIATIONS OF PHASE AND AMPLITUDE MODULATION

[75] Inventor: Edward J. Nossen, Cherry Hill, N.J.

[73] Assignee: RCA Corporation, Princeton, N.J.

[21] Appl. No.: 687,546

[22] Filed: Dec. 28, 1984

[51] Int. Cl.[4] .......................... H03C 1/00; H03C 3/00
[52] U.S. Cl. .................................... 332/16 R; 332/17; 332/23 R; 332/31 R; 332/48; 375/41; 455/108
[58] Field of Search ...................... 332/16 R, 17, 23 R, 332/31 R, 48; 375/41; 455/102, 108

[56] References Cited

U.S. PATENT DOCUMENTS

| | | |
|---|---|---|
| 3,170,127 | 2/1965 | Cramer . |
| 3,555,458 | 1/1971 | Fombonne . |
| 3,689,914 | 9/1972 | Butler ............................. 328/14 X |
| 3,987,374 | 10/1919 | Jones, Jr. . |
| 4,003,001 | 1/1977 | Jones ............................. 332/16 R X |
| 4,170,764 | 10/1969 | Salz et al. ............................. 332/17 |
| 4,206,424 | 6/1980 | Nossen ............................. 332/9 R |
| 4,206,425 | 6/1980 | Nossen . |
| 4,331,941 | 5/1982 | Kovalick et al. . |
| 4,355,289 | 10/1982 | Beyer et al. . |
| 4,484,296 | 11/1984 | Treise et al. ....................... 364/607 |

FOREIGN PATENT DOCUMENTS 0166333 12/1980 Japan ............................. 332/16 R

OTHER PUBLICATIONS

Article–Frequency Domain Yields its Data to Phase–Locked Synthesizer, by Gibbs et al., published in Electronics Magazine, Apr. 27, 1978, pp. 107–113.

Primary Examiner—Eugene R. LaRoche
Assistant Examiner—D. C. Mis
Attorney, Agent, or Firm—Joseph S. Tripoli; Robert L. Troike; William H. Meise

[57] ABSTRACT

A phase modulator includes a digital frequency word generator, an adder and a register arranged to generate recurrent digital sawtooth signals at a carrier rate. A second digital adder is coupled to receive the sawtooth signals and also receives digital information signals. The adder produces recurrent digital sawtooth signals phase-modulated by the information signal. A pair of adders receive the digital sawtooth signals and mutually sign-reversed digital information signals to produce a pair of oppositely phase-modulated constant-amplitude signals in a pair of channels. A sine memory is addressed by the phase-modulated digital sawtooth signals to produce phase-modulated sinusoidal-representative digital signals. The digital signals are then converted to analog signals. Since the two channels contain signals which are phase-modulated but not amplitude-modulated, the signals may be amplified by nonlinear amplifiers. An adder is coupled to the outputs of the two channels to sum together the two phase-modulated signals to produce an amplitude-modulated signal. Combinations of amplitude and phase modulation may be generated by a combined structure.

9 Claims, 13 Drawing Figures

Fig. 7
AMPLITUDE MODULATION

Fig. 8

BLOCK DIAGRAM FOR EXPRESSION I $EXP\ I \Rightarrow s(t) = \sin(wt+\phi)+(wt+\phi+\Delta\phi)$

DIGITAL MODULATOR WITH VARIATIONS OF PHASE AND AMPLITUDE MODULATION

This invention relates to an arrangement for using a digital phase modulator in order to achieve generalized modulation such as amplitude modulation, frequency modulation and the like. More particularly, the invention relates to a phase modulator and to an amplitude modulator implemented by the use of phase modulators.

Amplitude modulation (AM) transmitters are well-known, and have been used commerically for many years. In amplitude modulation, a carrier signal at a carrier frequency is changed in amplitude in response to an information signal, which for many applications is an audio signal. Since broadcasting of a AM signal by means of antennas or transmission of an AM signal over a transmission line results in attenuation of the signal at the receiver, the power to be transmitted is often very large. When amplitude modulation is accomplished at a low signal level, it may be necessary to amplify the modulated signal to a high power level for broadcast or transmission. It has been found, however, that amplifying devices are subject to amplitude and phase nonlinearities which vary from point to point on their transfer functions, and therefore the amplified amplitude-modulated signal is distorted both in amplitude and in phase by comparison with the low-level or unamplified amplitude-modulated signal. A large body of technical art has grown up directed towards predistortion of the low-level signal to compensate for the distortions caused by amplification of the amplitude-modulated signal.

Figure 1:
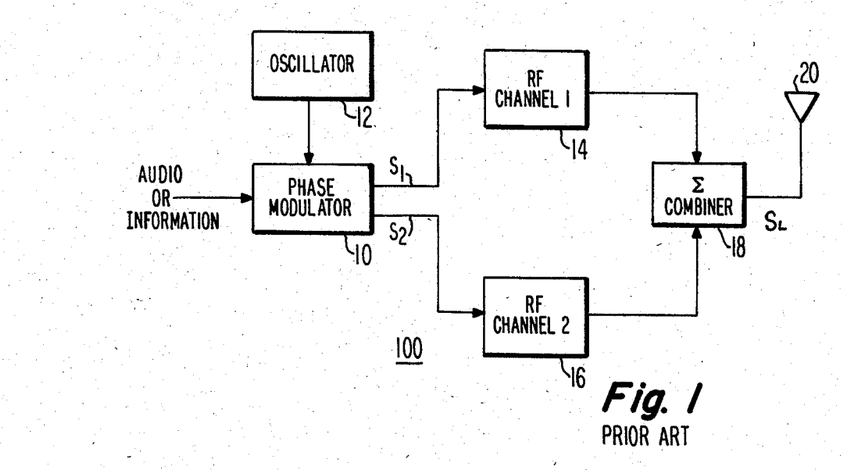
FIG. 1 is a block diagram describing a prior-art ampliphase amplitude modulation system.
Figure 2:
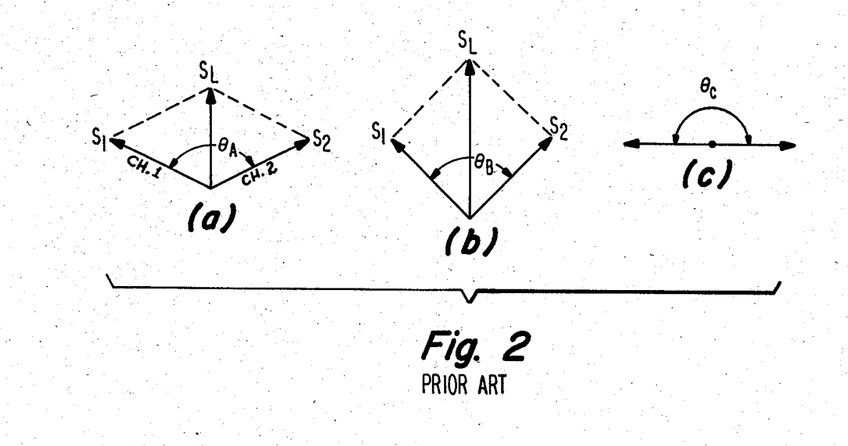
FIGS. 2a through 2c illustrate vector diagrams aiding in understanding the arrangement of FIG. 1.

It is well known that an amplitude-modulated carrier may be represented by a carrier vector and two contrarotating vectors originating at the tip of the carrier vector. These contrarotating vectors represent the upper and lower sidebands of the AM signal when the modulating signal is a pure tone, as is described for example beginning at page 531 in "Reference Data for Radio Engineers" fourth edition, 1956, published by ITT. A known arrangement for generating high-power AM signals without excessive distortion uses nonlinear amplifiers to amplify a continuous-wave (CW) signal in which the amplitude of the signal being amplified does not change, and consequently in which the incremental or differential phase and differential amplitude or gain are essentially zero. This system, known as the outphasing or ampliphase system, is described in conjunction with FIGS. 1 and 2. In FIG. 1, an audio or other information signal is applied to a phase modulator 10 which phase-modulates a carrier-frequency carrier signal which is received from an oscillator 12. Two carrier-frequency phase-modulated outputs of phase modulator 10 are applied to first and second radio-frequency channels 14 and 16 which include high-power amplifiers, and the amplified signals from channels 14 and 16 are applied to inputs of a passive summer or combiner 18, where they are added to produce the signal to be broadcast and/or transmitted by an antenna 20. In the quiescent condition or in the absence of an audio or information signal, phase modulator 10 produces two mutually phase-shifted output signals S1 and S2 having a phase angle $\theta_A$ therebetween of approximately 135°, as illustrated in FIG. 2a. Signals S1 and S2 when amplified through channels 14 and 16 remain undistorted, and when summed together in combiner 18 produce a carrier signal SL at the load having a predetermined value, as illustrated by vector SL (the subscript L indicating LOAD) in FIG. 2a. Full amplitude modulation is achieved by phase-modulating the signal from oscillator 12 to produce a pair of signals S1 and S2 which have an included angle therebetween which varies from $\theta_B=90°$ at one extreme of the audio or information signal to an included angle $\theta_C=180°$ at the opposite extreme. As illustrated in FIGS. 2b and 2c, included angles of 90° and 180° result in maximum carrier and zero carrier levels, respectively, when signals S1 and S2 are summed. The signals S1 and S2 illustrated as vectors in FIG. 2 both have the same magnitude. As mentioned, the main advantage of the ampliphase system is that continuous-wave (CW) signals (signals always having the same peak magnitude) are amplified by the high-power amplifiers of the transmitter or broadcaster, and the lack of amplitude changes of these CW signals eliminates distortions associated with the effect of changes in amplitude on the high-power amplifier.

It has been found that a major disadvantage of the aforementioned ampliphase amplitude-modulation system is the great accuracy needed in the phase modulator in order to achieve the linearity of modulation necessary for critical applications. The ampliphase or outphasing system for amplitude modulation is described in U.S. Pat. No. 3,170,127, and the problem of the phase modulation accuracy is also described therein. It is desirable to use digital techniques for amplitude modulation.

U.S. Pat. No. 4,331,941 issued May 25, 1982 to Kovalick et al describes a digital phase modulator in which a phase accumulator generates digital representations of a sawtooth signal at a recurrence rate equal to the desired carrier rate and applies them to a digital adder. The information signal which is to phase-modulate the carrier is inverted at the clock frequency and applied to second input of the digital adder to produce a digital signal representative of a sawtooth which is increased and decreased in phase by the information signal on alternate cycles of a high-frequency clock. This alternating-phase digital signal is applied to a sine look-up ROM to produce a digital representation of a sinusoid in which the phase is incremented and decremented at the clock rate, which is high relative to the sinusoidal signal recurrence rate. A digital-to-analog converter (DAC) and low-pass filter produce an amplitude-modulated output signal. This arrangement for amplitude-modulation suffers from the major disadvantage that there is no location in the generator chain prior to the output low-pass filter at which a continuous wave signal occurs which can be amplified to high power without introducing distortion in the high-power amplifier.

SUMMARY OF THE INVENTION

A phase modulator according to the invention includes a source of digital sawtooth signal having a recurrence rate equal to the recurrence rate of the carrier to be modulated. A digital adder is coupled to the source of digital sawtooth signal and to a source of digital information signal for adding together the sawtooth signal and the digital information signal to form a phase-shifted digital sawtooth signal which is phase-shifted relative to the digital sawtooth signal from the source. The phase-shifted digital sawtooth signal is applied to a memory for generating an analog sinusoidal signal at the carrier frequency. According to another aspect of the invention, a pair of phase modulators receive their drive signals from a digital processor which produces two mutually inverted phase modulator drive signals, which cause the pair of phase modulators to produce a pair of phase-modulated recurrent sawtooth signals having mutually opposite phase swings in response to the information signal. Each recurrent sawtooth signal is applied to a memory arrangement for producing a pair of continuous-wave analog sinusoids which are mutually phase-shifted in response to the information signal and which may be amplified to high power. A summing circuit receives the pair of phase-shifted continuous-wave signals and sums them for generating a carrier amplitude-modulated with the information signal.

DESCRIPTION OF THE INVENTION

A phase modulator designated generally as 300 in FIG. 3 includes a digital sawtooth signal generator 306, which includes a source 310 of a digital frequency number which establishes the frequency of the carrier signal being modulated, as described below. The digital frequency number is preselected and does not ordinarily change during operation. The frequency number is applied to a clocked adder or summer 312 in which the digital number is added to the digital value applied to a second input of the adder over a conductor set 314. Conductor set 314 may include more than a single conductor, as suggested by the slash mark, for carrying multiple simultaneous bits. For simplicity, such sets will hereafter be termed simply "conductor". Adder 312 adds together at each clock cycle the digital frequency number and the digital signal applied to its second input over conductor 314 to produce a sum signal which is applied to a register or latch 316 which latches the sum signal and which applies the latched sum signal back over conductor 314 to the input of adder 312. In this arrangement, a digital number is generated at the output of register 316 which increments by the frequency number at each clock cycle. Thus, the digital number on conductor b is a digital number representing or equivalent to a quantized sawtooth signal such as sawtooth signal 412 of FIG. 4b. The quantization of the sawtooth signal is suggested by the various levels of signal 512 of FIG. 5. It is of course understood that the digital representation is merely by means of a plurality of ones and zeros as is well known in the art. The monotonically increasing digital number on conductor b eventually causes register 316 to overflow and to start again from a near-zero value, thereby causing the digital number on conductor b to recurrently drop to or near zero value and to increment during each clock cycle by the magnitude of the digital frequency number. The number of stages of register 316, the clock recurrence rate and the magnitude of the digital frequency number are selected so that the digital number on conductor b produces a sawtooth-representative signal which recurs at the recurrence rate of each cycle of the modulated carrier to be generated. A clock signal generator illustrated as 308 produces on conductor labeled a clock signals which are at a frequency which is high relative to the frequency defined by the recurrence rate of the digital sawtooth signal. The clock signals are applied to adder 312, register 316 and to other timed elements in modulator 300.

Figure 4:
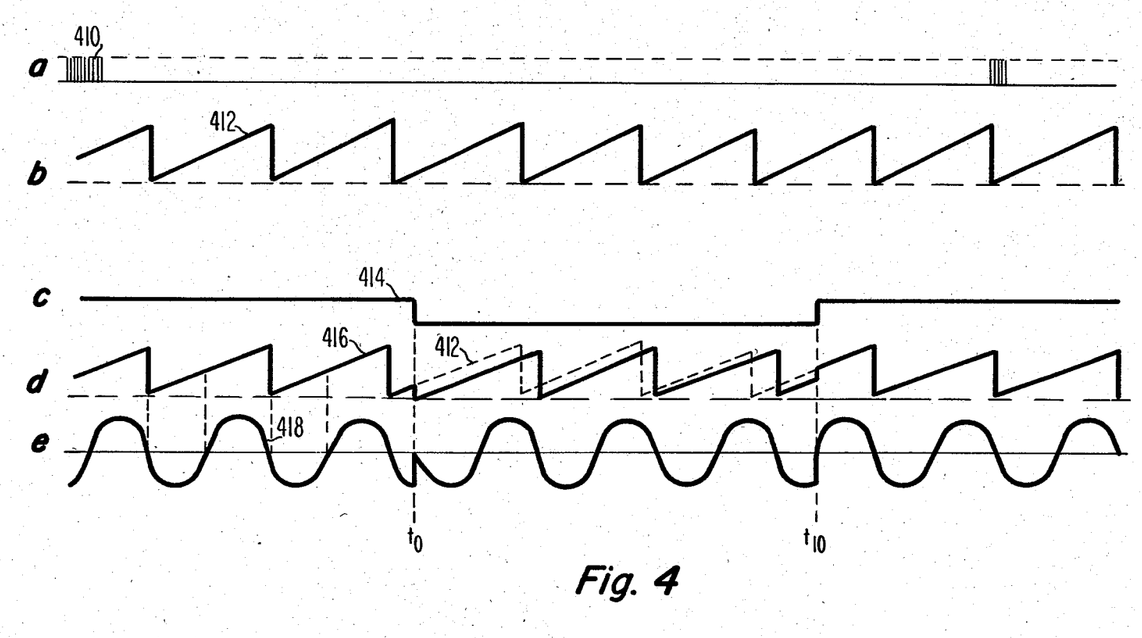
FIGS. 4a through 4e illustrate as amplitude-time plots certain signals including a digital sawtooth occurring in the arrangement of FIG. 3 during operation.

The digital sawtooth-representative signal on conductor b is applied to a first input of a clocked adder or summer 318. A digital information or modulating signal is applied to a second input of adder 318 over conductor c. The digital information signal may be generated from an analog information signal by an analog-to-digital converter (ADC) 320. Adder 318 at each clock cycle adds together the current value of the digital sawtooth signal applied from conductor b and the digital information signal from conductor c to produce a phase-shifted sawtooth signal on conductor d. Adder 318 overflows when the sum of the digital sawtooth signal and the digital information signal exceeds the peak value of the digital sawtooth signal alone. This may be better understood by reference to FIGS. 4c and d. In FIG. 4c, two-level waveform 414 represents in simplified form a signal which is to phase-modulate the carrier. The desired modulation as illustrated is simply a first phase before time $t_0$, a second phase in the interval $t_0$–$t_{10}$ and a return to the original phase condition at time after time $t_{10}$. Waveform 416 in the interval prior to time $t_0$ represents the sawtooth output of adder 318 in-phase with the input signal 412, thereby indicating that no phase shift has taken place, or that the magnitude of the digital information signal applied to adder 318 over conductor c has zero magnitude. At time $t_0$, a digital value is applied over conductor c to adder 318 and is added to the value of the sawtooth. Since the digital information signal on conductor c has a constant value, its addition to the sawtooth signal represents a simple magnitude offset, such as the offset indicated at time $t_0$. As illustrated, the added digital information signal has a negative value which happens to reduce the sawtooth signal to a value near zero at time $t_0$, and consequently the digital information as illustrated has an approximate magnitude of one-fourth of the peak value of the sawtooth. For this particular value of digital information signal, a phase delay of the sawtooth 416 relative to the digital sawtooth 412 results, as can be seen by comparing waveform 416 with the dashed line in the interval $t_0$-$t_{10}$ representing sawtooth 412. After time $t_{10}$, the digital information signal returns to zero value, and the negative magnitude no longer affects the sawtooth waveform, which thereupon makes a step increase in magnitude so as to become once again congruent with digital sawtooth wave form 412. Thus, it can be seen that adder 318 causes a phase-shift of the sawtooth signal which depends upon the magnitude of the modulating signal. In general, for more complex modulating signals than signal 414, more complex phase modulation will occur.

Figure 3:
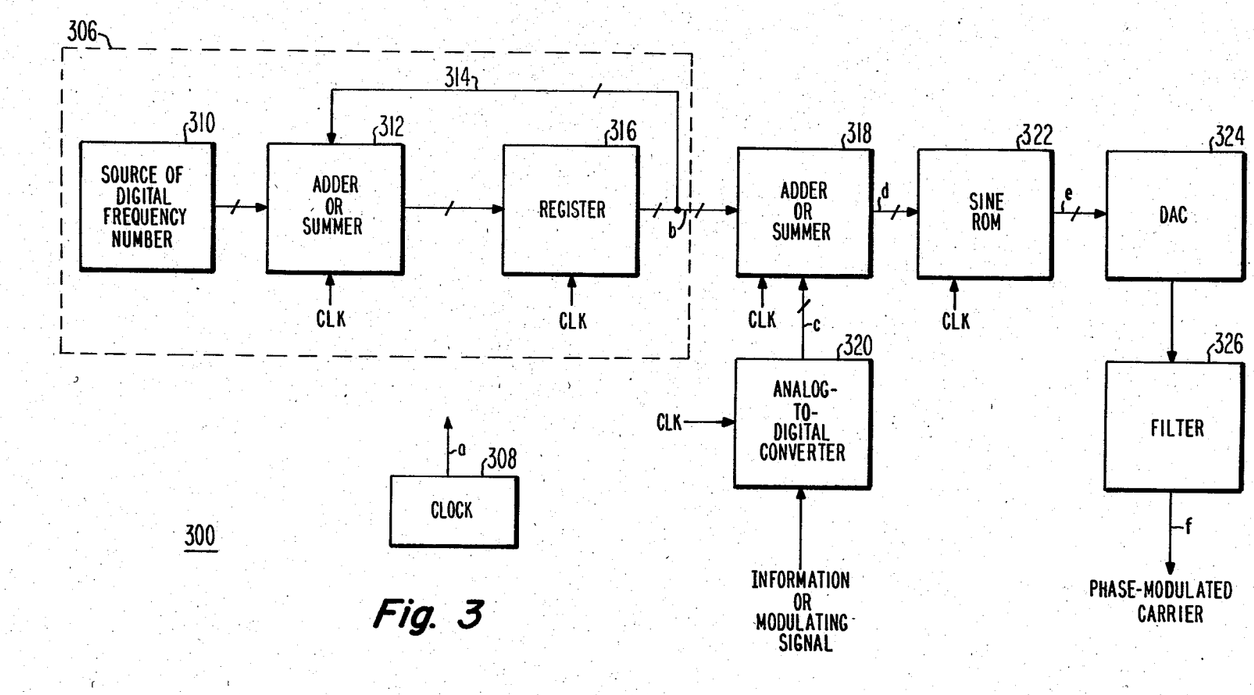
FIG. 3 illustrates in block-diagram form a digital phase modulator according to the invention.
Figure 5:
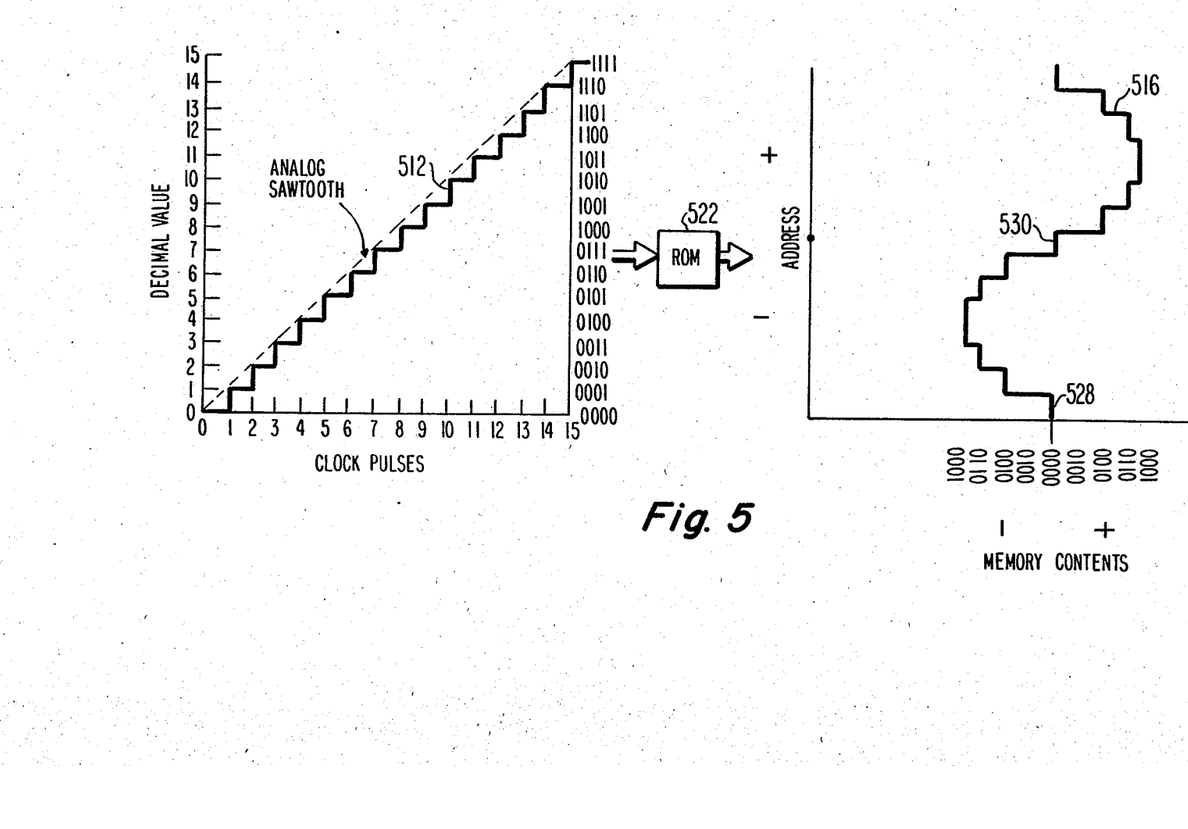
FIG. 5 illustrates in some detail a digital sawtooth waveform occurring in the arrangement of FIG. 3 together with its relationship to a memory and a sinusoidal output signal.

The phase-modulated signal produced at the output of adder 318 in FIG. 3 is applied over a conductor d to a sine ROM 322. ROM 322 is an addressable memory which is addressed by the digital signals on conductor d and which is preprogrammed with values representing a sinusoid. This is more easily understood by reference to FIG. 5. In FIG. 5, waveform 512 represents in analog form the value of a sawtooth signal for various clock pulses. Actual conversions of digital signals to analog occurs at digital-to-analog converter 324. The analog value represented by the sawtooth is indicated at the left of waveform 512, and the corresponding 4-bit digital value is represented on the right. The 4-bit values represented by digital signal 512 are illustrated as being applied as addresses to ROM 522, and the corresponding preprogrammed values are illustrated by waveform 516. For example, the memory locations of ROM 522 corresponding to addresses 0000 and 1000 are each preprogrammed with digital values 0000, and correspond to levels 528 and 530, respectively. These are the zero crossings of the equivalent sinusoid. Thus, as sawtooth 512 recurrently takes excursions from 0000 to 1111, ROM 522 outputs digital numbers including numbers representative of zero crossings of the sinusoid. During the first or lower part of sawtooth 512, addresses 0000 to 0110 applied to ROM 522 produce outputs from the ROM representing negative values of a sinusoid. The second or upper portion of sawtooth 512, having values ranging from 1001 to 1111, produce memory outputs which represent the values of the positive half-cycle of the sinusoid. Naturally, the number of quantization levels is selected to provide as accurate a representation of a sinusoid as may be desired. Thus, the recurrent excursions from 0000 to 1111 of sawtooth 512 produces recurrent negative and positive-going excursions of the digitized sinusoid 516.

Referring once again to FIG. 3, it can be seen that the recurrent sawtooth signal 412 applied to sine ROM 322 produces on conductor e a digital signal representative of a sinusoid 418, illustrated in FIG. 4e. The return to zero value of sawtooth 416 at time $t_0$ as a result of phase-modulation causes the digital address applied to sine ROM 322 to drop to its initial value, and thereby causes sine ROM 322 to produce a digital signal representing zero value for the first clock cycle after time $t_0$. This zero value represents a first zero-crossing of sinusoid 418. Subsequent to time $t_0$, waveform 416 is phase-shifted, and complete phase-shifted sinusoids are produced by sine ROM 322 until later time $t_{10}$, at which time there is an abrupt positive-going change in magnitude of waveform 416 to a value which is half-way up the sawtooth, thereby causing sine ROM 322 to produce the corresponding portion of a sinusoid, which happens to again be near zero value. Thus, that portion of sinusoid 418 preceding time $t_0$ is in-phase or coherent with that portion following time $t_{10}$. The phase-shifting of sawtooth address waveform 416 addressing ROM 322 causes a corresponding phase-shift of the digital output signal representing a sinusoid.

The digital output signal of sine ROM 322 is applied to a digital-to-analog converter (DAC) 324 to produce an analog sinusoid corresponding to the digital signal. Quantizing noise is removed by a filter 326 to produce on output conductor f, a sinusoidal carrier, the recurrence rate of which tracks the recurrence rate of sinusoidal signal 412, with the phase modulation imparted by the information signal.

Figure 6A:
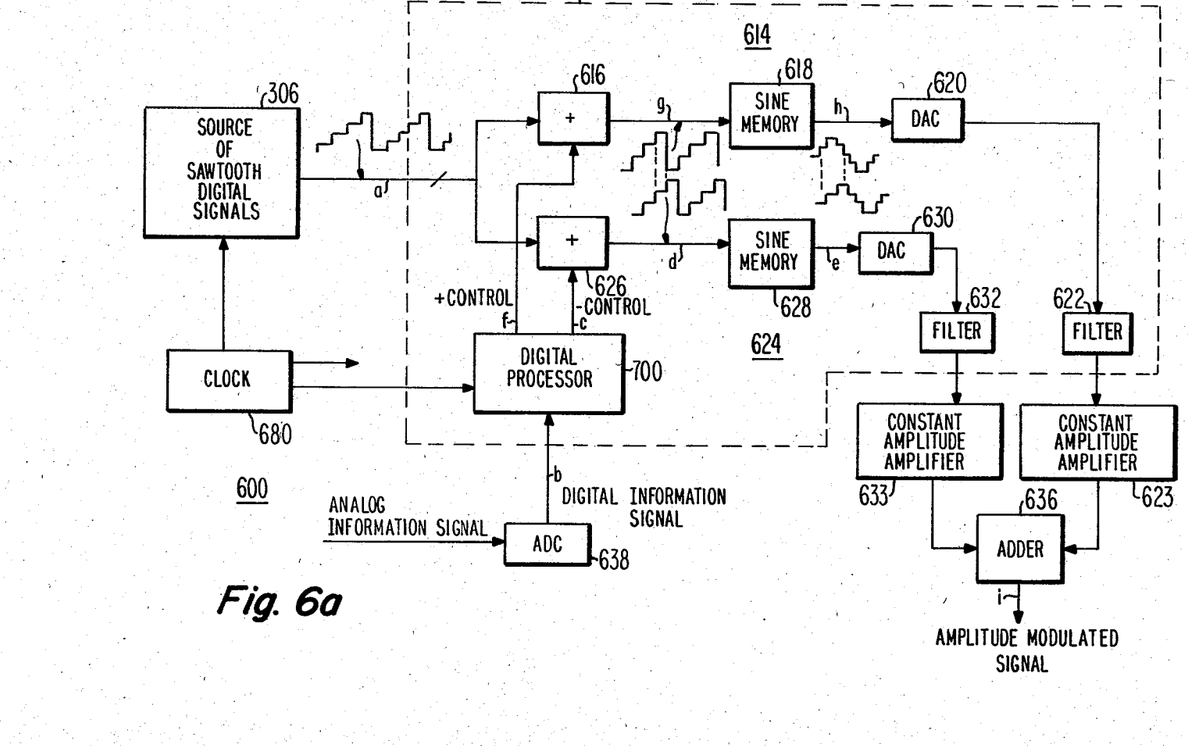
FIG. 6a is a block diagram with illustrative waveforms of an amplitude-modulator according to an embodiment of the invention, and 6b is a detail thereof.

FIG. 6a illustrates in block-diagram form an arrangement for using a pair of phase modulators generally as described in conjunction with FIG. 3 to produce amplitude modulated signals. In FIG. 6, block 306 corresponds to digital sawtooth signal generating block 306 of FIG. 3 and, generally speaking, represents a source of digital sawtooth signals which are coupled over conductor labeled a to adders 616 and 626 of a pair of channels 614 and 624, respectively. Second inputs of adders 616 and 626 receive digital information signals as described below. Channel 614 includes an adder 616, a sine memory 618, a DAC 620 and a filter 622, corresponding to the arrangement of FIG. 3. Similarly, channel 624 includes adder 626, sine memory 628, DAC 630 and filter 632, also corresponding to the arrangement of FIG. 3. The constant-peak-amplitude analog sinusoidal signal outputs of filters 622 and 632 are applied to amplifiers 623 and 633, respectively, which amplify the constant-amplitude signals. The amplified sinusoidal signals from amplifiers 623 and 633 are applied to a passive adder or summing circuit 636 to produce the desired amplitude-modulated signal.

Figure 7:
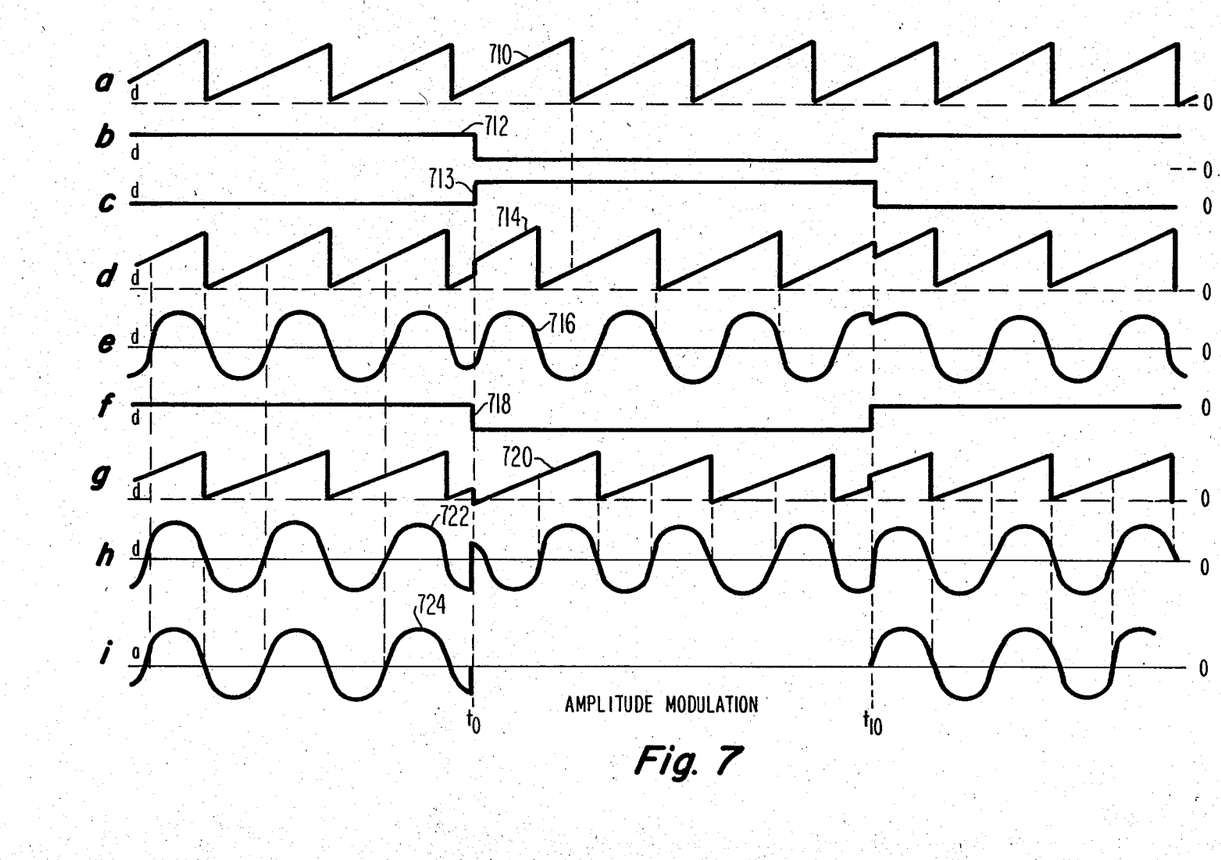
FIGS. 7a through 7i are amplitude-time waveforms aiding in understanding the operation of the arrangement of FIG. 6.

Digital processor 700 of FIG. 6a receives the information signal over a conductor b from an ADC 638 and produces therefrom at each clock pulse a plus (+) control signal on conductor f and a minus (−) control signal on conductor c. The plus and minus control signals on conductors f and c are applied to inputs of adders 616 and 626, respectively, for phase-modulating the sawtooth signals on conductor labeled a by positive and negative amounts. FIG. 7a illustrates the recurrent digital sawtooth wave on conductor labeled a which is applied to the inputs of adders 616 and 626. Waveform 712 of FIG. 7b represents the digital information signal on conductor b applied to digital processor 700, and waveform 713 of FIG. 7c represents the negative control signal applied over conductor c to an input of adder 626. It can be seen that waveform 713 is reversed in direction relative to waveform 712, representing an inversion process which occurs in digital processor 700. Phase-shifted sawtooth waveform 714 of FIG. 7d represents in analog form the phase-shifted sawtooth wave produced by adder 626 on conductor d, and digital wave 716 represents in analog form the output of sine memory 628. Similarly, waveform 718 of FIG. 7f represents the positive control signal on conductor f which is applied to adder 616 for phase-shifting sawtooth signal 710, 720 of FIG. 7g represents in analog form the phase-shifted sawtooth signal on conductor g, 722 represents in analog form the digital output signal from sine memory 618 on conductor h, and analog waveform 724 of FIG. 7i illustrates the sum of the analog signals on conductor i at the output of adder 636 corresponding to waveform 716 and 722. As can be seen, the phase-shifted output signals cancel in the region $t_0$-$t_{10}$, thereby representing complete amplitude modulation by the signal represented by waveform 712. Naturally, smaller amplitudes of modulating signal 712 will result in less depth of amplitude modulation of the carrier than that illustrated in FIG. 7i.

Figure 6B:
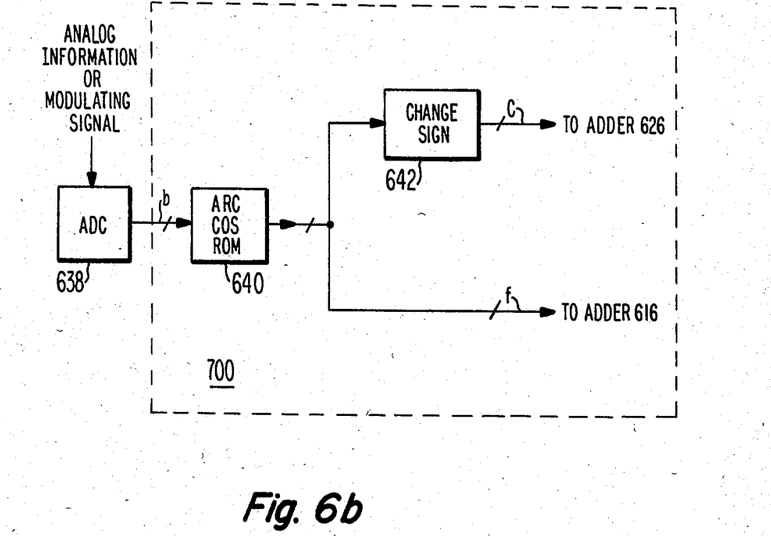

FIG. 6b illustrates details of digital processor 700. The digitized information signal applied to processor 700 is applied as addresses to an arc cosine ROM 640, the memory locations of which are preprogrammed with a digital word representing the angle Φ of modulation. For example, if the signal on conductor b represents the maximum anticipated amplitude of the information signal, the memory location which is addressed by the digital value on conductor b selects a preprogrammed word which when processed and phase-modulated according to the arrangement of FIG. 6a produces the maximum amplitude of the amplitude-modulated signal on conductor i. Similarly, if the signal on conductor b applied to ROM 640 is the smallest signal which is expected, or has zero value, the work addressed in ROM 640 will be such as to produce zero output amplitude from adder 636 for those cases where negative values of the inputs signals are not expected, and produces nominal output in those cases where negative-going excursions of the input signal are expected. Negative-going input signals may be expected where the input signal is AC coupled so that positive and negative extremes occur about an average value of zero. If negative values of input signal are expected, the negative extreme value selects in ROM 640 a word which through the two-channel phase modulation and addition process produces the least output from adder 636. As may be understood by referring back to FIG. 2, amplitude modulation by the outphasing system requires that for each phase angle increment of one of the two signals to be added together, an equal and opposite amount of modulation must be applied to the other signal. Consequently, the sign of the signal applied to adder 626 is reversed by inverter 642. Thus, mutually-inverse digital words representing positive and negative phase angles are applied to the phase-modulated inputs of adders 616 and 626 to produce the mutually out-of-phase signals required to achieve the amplitude modulation in the arrangement of FIG. 6a.

Figures 8, 9:
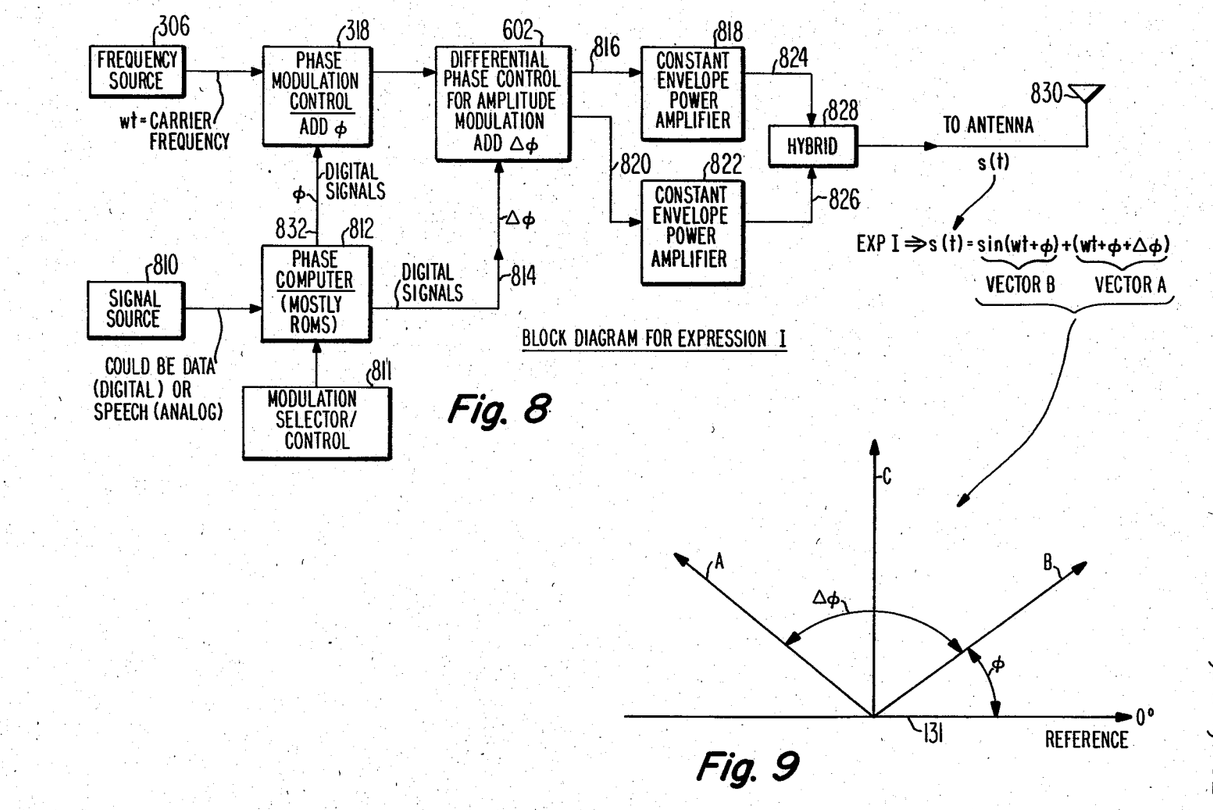
FIG. 8 is a simplified block diagram of an arrangement incorporating both phase and amplitude modulation according to an aspect of the invention.
FIG. 9 is a vector diagram aiding in the understanding the arrangement in FIG. 8.

FIG. 8 illustrates an arrangement including both amplitude and phase modulation. In FIG. 8, a frequency source 306 produces sawtooth signals as described previously at a carrier frequency wt and applies them to phase modulation control block 318 as described for phase modulation under the control of digital signals representing the desired phase angle applied to a second input of phase modulation control circuit 318 over conductor 832. The phase-modulated signals are applied to the input of differential phase control circuit 602 corresponding to the two-channel arrangement 602 of FIG. 6a for producing a pair of phase-modulated signals on conductors 816 and 820 which are applied to constant-envelope power amplifiers 818 and 822, respectively, which generate high power signals which are summed together in a hybrid 828 for application to an antenna 830. Phase computer 812 includes a plurality of ROMs each of which is preprogrammed with a different type of transfer function for translating the signal from information signal source 810 into Φ-representative (phase modulation control) and ΔΦ representative (amplitude modulation control) signals. A modulation selector control 811 selects from among the ROMs of phase computer 812 those having transfer functions appropriate for the desired type of modulation, such as for AM, PM, FSK or PSK. The type of modulation may include not only the phase modulation and amplitude modulation previously discussed, but also those types of modulations resulting from a combination of both phase and amplitude modulation. Such more general types of modulation include supressed-carrier modulation, single-sideband modulation and the like. The output signal s(t) generated at the output of hybrid 828 is described by the expression $$s(t)=\sin(wt+\Phi)+\sin(wt+\Phi+\Delta\Phi)$$

Each of the parenthetical expressions represents a vector. Sin(wt+Φ) represents a vector A illustrated in FIG. 9, while sin (wt+Φ+ΔΦ) represents a vector B illustrated in FIG. 9. FIG. 9 also illustrates the angles ΔΦ and Φ which result in a sum vector C which represents the final signal s(t).

Figures 10, 11:
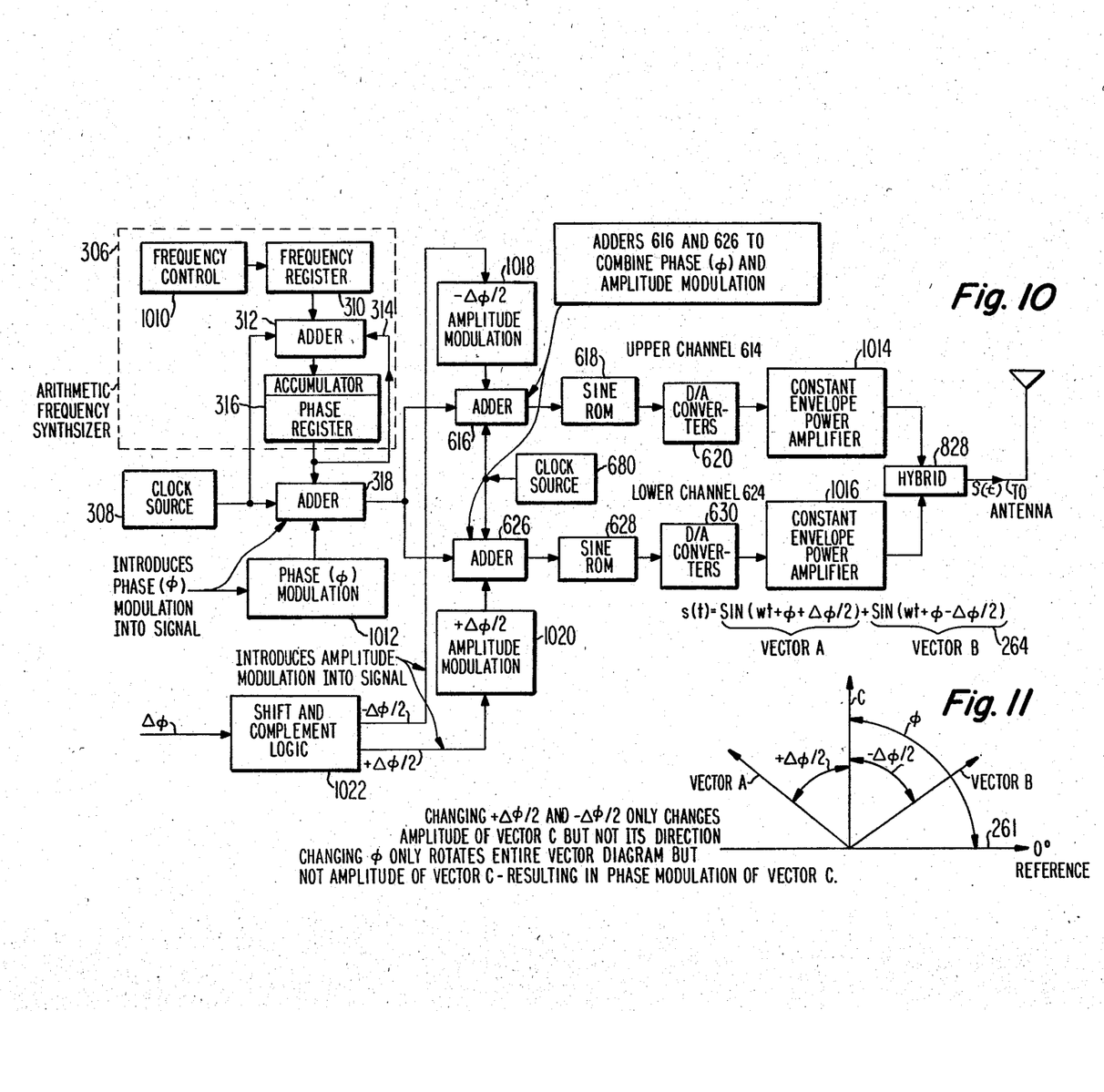
FIG. 10 is a detailed block diagram of a modulator providing both phase and amplitude modulation
FIG. 11 is a vector diagram aiding in understanding the arrangement of FIG. 10.

FIG. 10 is a somewhat more detailed version of the block diagram shown in FIG. 8. FIG. 11 is the corresponding vector diagram.

Figures 12, 13:
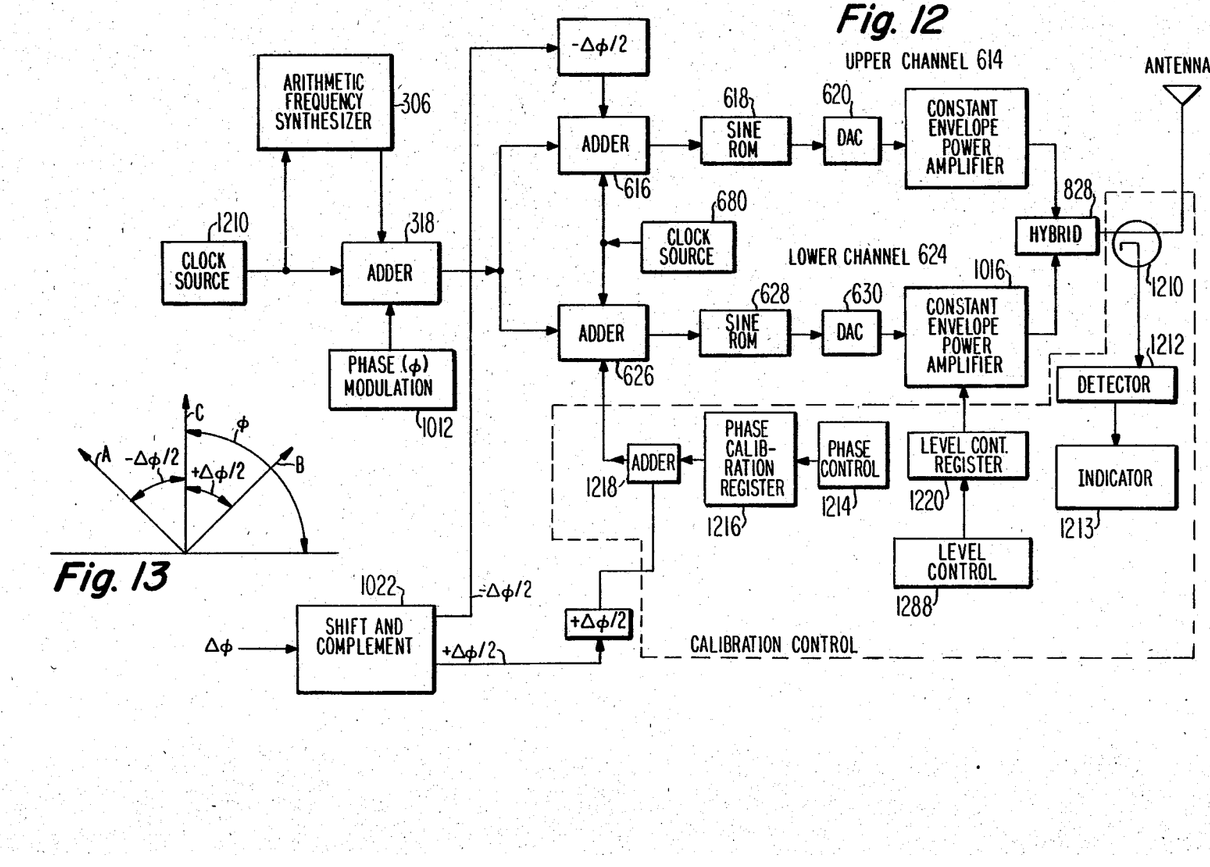
FIG. 12 is a block diagram of an arrangement providing amplitude and phase modulation, and further including setup controls for enhanced performance.
FIG. 13 is a vector diagram aiding in understanding the operation of the arrangement of FIG. 12.

FIG. 12 illustrates in block-diagram form a generalized modulator as described in conjunction with the preceding FIGURES, further including amplitude and phase control circuits for calibrating the modulator. It will be recognized that accuracy in generating the two phase-modulated signals in upper and lower channels such as 614 and 624 will not provide correct modulation if the characteristics of the constant-envelope power amplifiers are not identical. It is not necessary that the amplifiers be linear, but only that their characteristics be matched. The arrangement of FIG. 12 controls the level or amplitude of the output signal and also uses a phase calibration to adjust for any phase error between the channels. In FIG. 12, a directional coupler 1210 samples the modulated output signal and applies the sample to a detector 1212 for demodulation. The demodulated output from detector 1212 is applied to an indicator 1213 for displaying the envelope. A controllable digital level control illustrated as a block 1288 is coupled to a level control word register 1220 which in turn is coupled to an amplitude-control input of power amplifier 1016. A phase control 1214 generates a digital word which is applied to a phase calibration register 1216. The word stored in phase calibration register 1216 is applied to an input of an adder 1218 together with the plus control from a digital processor 1022 which includes shifting and complement circuits. Processor 1022 performs essentially the same function as processor 700 of FIG. 6. The output from adder 1218 is applied to an input of adder 626.

Phase calibration is accomplished by setting the modulation signal ΔΦ to that value (180°) which is intended to make the output signal from hybrid 828 have zero magnitude. Phase control 1214 is then adjusted to minimize the output signal from hybrid 828, which compensates for any residual phase errors. Phase calibration register 1216 then latches the phase correction word and maintains it during normal operation. Any residual output signal existing after phase calibration is due to unequal amplifier output signals, and level control 1288 may be adjusted to zero the output signal from hybrid 828. The level control word producing the best null is latched in register 1220 and held during normal operation. When normal modulation again begins, the latched phase calibration word is continuously added in adder 1218 to the (+Δ/2) modulation to maintain the phase correction, and an amplitude calibration word is constantly applied to power amplifier 1016 to maintain correct amplitude.

Other embodiments and variations of the invention will be obvious to those skilled in the art. For example, serial digital processing may be used instead of the parallel digital processing described. Signals modulated is a manner according to the invention may be combined with signals modulated in conventional manners, as for example a television video signal amplitude-modulated according to the invention may be combined with an audio signal FM modulated by a conventional modulator. The analog sinusoidal signals in the two channels may be frequency-converted to the desired final frequency before or after amplification by constant-envelope amplifiers, or the single output signal from the output adder as of FIG. 6a may be frequency-converted to the final frequency. More complex types of calibration controls may be used, including automatic controls which respond to predetermined modulating signal conditions to update the calibration correction.

What is claimed is:

1. A modulator, comprising:
   a source of digital information signal;
   amplitude control signal generating means coupled to said source of digital information signal for generating a first digital amplitude control signal proportional to said digital information signal and for generating a second digital amplitude control signal equal in magnitude and opposite in polarity to said first digital amplitude control signal;
   a digital sawtooth signal generator for generating a digital sawtooth signal having a recurrence rate equal to the desired carrier frequency;
   first digital adding means coupled to said digital sawtooth signal generator and to said amplitude control signal generating means for adding together said digital sawtooth signal and said first digital amplitude control signal for generating a first phase-shifted digital sawtooth signal;
   second digital adding means coupled to said digital sawtooth signal generator and to said amplitude control signal generating means for adding together said digital sawtooth signal and said second digital amplitude control signal for generating a second phase-shifted digital sawtooth signal;
   first and second addressable memory means coupled to said first and second digital adding means, respectively, said first and second addressable memory means being addressed by said first and second phase-shifted digital sawtooth signal for generating first and second mutually phase-shifted sinusoidal analog signals; and
   summing means coupled to said first and second addressable memory means for adding together said first and second mutually phase-shifted analog sinusoidal signals for generating a carrier signal at said recurrence rate amplitude-modulated by said digital information signal.

2. A modulator according to claim 1, wherein said source of digital information signal comprises a source of analog information signal and analog-to-digital conversion means coupled to said source of analog information signal for generating said digital information signal.

3. A modulator according to claim 1, wherein said amplitude control signal generating means comprises digital inverting means coupled to said source of digital information signal for reversing the polarity of said digital information signal for generating said second digital amplitude control signal.

4. A modulator according to claim 1, wherein said digital sawtooth signal generator comprises:
   a source of digital frequency control word;
   a souce of clock signal having a pulse recurrence rate greater than said recurrence rate of said sawtooth signal;
   an adder including a clock input terminal coupled to said source of clock signal, first digital input signal terminal means coupled to said source of digital frequency control word and also including second digital input signal terminal means, for adding together at each said clock pulse of said source of clock signal said digital frequency control word and a digital word applied to said second digital input signal terminal means for producing an incremented digital signal; and
   accumulator means including input terminals coupled to said source of clock signal and to said adder and also including output terminal means coupled to said second digital input signal terminal means of said adder, for receiving said incremented digital signal and at each said clock pulse for coupling said incremented digital signal to said output terminal means of said accumulator means for closing a loop whereby said digital sawtooth signal is generated at said output terminal means of said accumulator means.

5. A modulator according to claim 1 further capable of phase modulation simultaneous with amplitude modulation to produce more general forms of modulation, wherein said digital sawtooth signal generator is capable of phase modulation and further comprises:
   a source of unmodulated recurrent monotonic digital signal having a recurrence rate equal to the recurrence rate of said carrier to be modulated;
   an adder coupled to said source of unmodulated recurrent monotonic digital signal and to said source of digital information signal for adding together said unmodulated recurrent monotonic digital signal and said digital information signal to form said digital sawtooth signal phase-shifted by said digital information signal whereby said carrier signal amplitude-modulated by said digital information signal is also phase-modulated by said digital information signal to produce a general form of modulation.

6. A modulator according to claim 1, wherein said first and second addressable memory means comprise ROMs preprogrammed for linear-to-sinusoidal conversion.

7. A modulator according to claim 1, wherein said first and second addressable memory means comprise:
   first and second addressable digital memories each preprogrammed at each address with a digital word which is selected to produce a digital representation of said sinusoidal analog signals when addressed in a monotonic fashion; and
   digital-to-analog conversion means coupled to said first and second addressable digital memories for generating said sinusoidal analog signals from said digital representation of said sinusoidal analog signals.

8. A modulator according to claim 1 further comprising:
   first and second amplifying means coupled to said first and second addressable memory means, respectively, and to said summing means for amplifying said first and second mutually phase-shifted sinusoidal analog signals, respectively, for application to said summing means.

9. A modulator according to claim 1 further comprising:
a source of digital phase calibration word selected for nulling said carrier signal when said first and second digital amplitude control signals together are indicative of a null; and third digital adding means coupled to said source of digital phase calibration word and to one of said first and second digital adding means for adding said digital phase calibration word to one of said first and second phase-shifted digital sawtooth signals.

* * * * *